United States Patent [19]
Takeda

[11] Patent Number: 4,547,736
[45] Date of Patent: Oct. 15, 1985

[54] PHASE LOCK LOOP PSK DEMODULATOR WITH SWEEP CONTROL CIRCUIT

[75] Inventor: Koichiro Takeda, Abiko, Japan

[73] Assignee: Fujitsu Limited, Kawasaki, Japan

[21] Appl. No.: 693,840

[22] Filed: Jan. 24, 1985

Related U.S. Application Data

[63] Continuation of Ser. No. 502,595, Jun. 9, 1983, abandoned.

[30] Foreign Application Priority Data

Jun. 18, 1982 [JP] Japan ................... 57-105205

[51] Int. Cl.$^4$ ................... H04L 27/22; H03L 7/12
[52] U.S. Cl. .................... 329/50; 329/122; 331/4; 331/23; 331/25; 331/DIG. 2; 375/81; 375/120
[58] Field of Search ............... 331/4, 23, 25, DIG. 2; 329/50, 122, 124; 375/81, 82, 94, 120

[56] References Cited

U.S. PATENT DOCUMENTS

| | | | |
|---|---|---|---|
| 4,000,476 | 12/1976 | Walker et al. | 331/4 X |
| 4,077,016 | 2/1978 | Sauders et al. | 331/4 |
| 4,092,606 | 5/1978 | Ryan | 329/124 |
| 4,121,166 | 10/1978 | Matsumoto et al. | 329/122 |

Primary Examiner—Siegfried H. Grimm
Attorney, Agent, or Firm—Staas & Halsey

[57] ABSTRACT

The present invention discloses a phase lock loop circuit which recovers a carrier for demodulating a PSK signal wherein a sweep signal is suspended when a decision signal indicates the phase-locked state. The level of the sweep signal is held and applied to the phase lock loop at the time the circuit becomes phase-locked, thereby an unwanted sweep signal component is no longer generated when the sweep stops. Thus stable phase-locked operation can be realized.

6 Claims, 6 Drawing Figures

PHASE LOCK LOOP PSK DEMODULATOR WITH SWEEP CONTROL CIRCUIT

This is a continuation of co-pending application Ser. No. 502,595, filed on June 9, 1983, and now abandoned.

BACKGROUND OF THE INVENTION

This invention relates to a phase lock loop circuit, particularly to a phase lock loop circuit which locks a phase of a recovered carrier to the received carrier of PSK (Phase-Shift-Keying) signal.

In a synchronous detection system for demodulating a PSK signal, a carrier being phase-locked to a carrier of a received PSK signal must be recovered. Therefore, in an existing synchronous detecting system of this type, an output obtained by detecting the received PSK signal with a recovered carrier is subjected to logical processing in order to remove the phase component. Then, the output signal is applied to a voltage controlled oscillator as a phase error signal and the phase of the recovered carrier output from the voltage controlled oscillator is locked to the phase of the received PSK signal.

In an ordinary phase lock loop circuit, a high performance loop which is less influenced by disturbance can be obtained by making the loop bandwidth narrower, but an excessively narrow loop bandwidth will invite deterioration of the tracking characteristics for the received PSK signal. Accordingly, a method for ensuring stable circuit operation with an excellent tracking characteristic and a narrow loop bandwidth has been proposed, wherein the specified sweep signal is superimposed on the phase error signal in order to control the voltage controlled oscillator until the synchronous operation or circuit is established and the supply of the sweep signal is suspended after the synchronous operation is established.

However, the known method for superimposing such sweep signal results in an extra sweep signal being generated at the time the superimposition of such sweep signal is suspended, thereby causing a disturbance to the phase lock loop. It has, therefore been desired to provide a phase lock loop which does not generate an unwanted sweep signal component and requires only a simple circuit structure.

SUMMARY OF THE INVENTION

It is an object of the present invention to provide a phase lock loop which assures an excellent tracking characteristic for the received PSK signal, and also stable operation.

It is another object of the present invention to prevent generation of an unwanted sweep signal in a phase locking method which uses a sweep signal.

In the phase lock loop of the present invention, the sweep signal generated from the sweep generator, is applied to a voltage controlled oscillator which generates a recovered carrier in accordance with a non-synchronous state decision signal generated by a decision means in the phase-locked state. The sweep signal generated by the sweep generator is held at the level provided just before the phase-locked state is established in accordance with the phase-locked state decision signal generated by the decision means in the phase-locked state.

DESCRIPTION OF THE PREFERRED EMBODIMENTS

Figure 1:
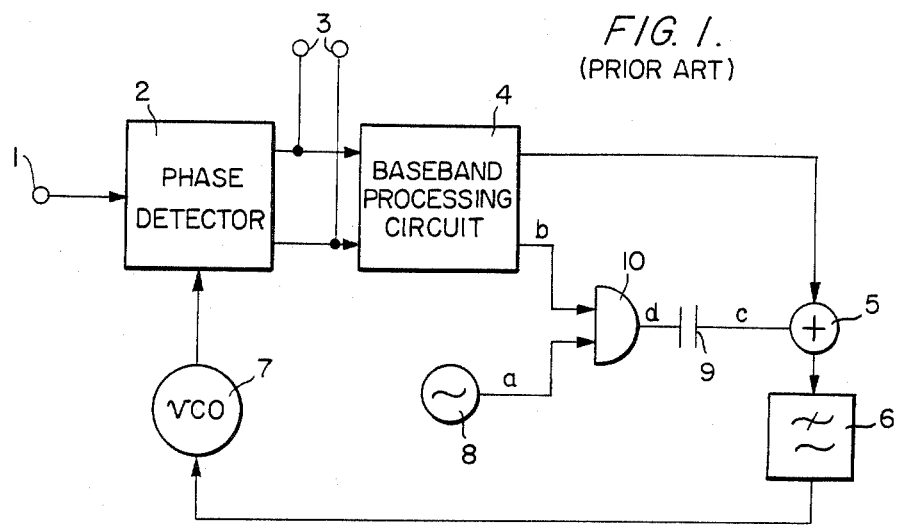
FIG. 1 is a block diagram of a known phase lock loop circuit which has an improved tracking characteristic as a result of superimposing the sweep signal on a phase error signal generated by the base band processing circuit.

FIG. 1 is a block diagram of a well known phase lock loop circuit.

In FIG. 1, 1 is an input terminal for a PSK signal; 2 is a phase detector; 3 is an output terminal for demodulated data; 4 is a baseband processing circuit; 5 is an adder; 6 is a loop filter; 7 is a voltage controlled oscillator; 8 is a sweep oscillator; 9 is a coupling capacitor; and 10 is an AND gate. When the received input is the 4-level PSK signal, the phase detector 2 synchronously detects the 4-level PSK signal using a recovered carrier from an output of the voltage controlled oscillator 7. The recovered carrier is phase-shifted by 90 degrees, then used to demodulate data which is provided for output at the output terminal 3. Such data is then applied to the baseband processing circuit 4. The baseband processing circuit 4 outputs a phase error signal and a decision signal b which informs whether or not the loop is phase-locked.

The phase error signal is, in the case of the synchronously detected 4-level PSK signal, indicated by $\sin(\theta + n/4 \cdot \pi)$, the $\sin 4\theta$ signal obtained by multiplying such signal by four in the baseband processing circuit 4 and by removing the phase component therefrom.

The decision signal b has a value of "1" or "0". It is obtained by integrating the $\cos 4\theta$ which is the signal having a phase difference of 90 degrees from the pertinent signal $\sin 4\theta$ and then comparing such integrated value with a specified threshold level. For example, the signal $\cos 4\theta$ is equal to 1 when $\theta = 0$ in the perfect phase-locked state and is equal to about 0.5 when detection is carried out for a non-phase-locked random signal. Therefore, if the threshold level is selected to be a value 0.75 and a value larger than such threshold level is obtained, the signal "0" is output as the decision signal b, indicating the phase-locked state. If a value smaller than the threshold level is obtained, the signal "1" is output as the decision signal b indicating the non-phase-locked state.

The phase error signal is applied as a control signal to the voltage controlled oscillator 7 via the loop filter 6 and the adder circuit 5. The phase of the recovered carrier in the output of the voltage controlled oscillator 7 is locked by the phase detector 2 to the carrier phase of the PSK signal applied to the input terminal 1. As mentioned above, the decision signal b sent from the base-band processing circuit 4 is "1" in the non-phase-locked state and "0" in the phase-locked state. Therefore, when the circuit is in the phase-locked state, the sweep signal a, sent from the sweep oscillator 8, is not applied to the voltage controlled oscillator 7 and the phase lock loop operates so that the phase error signal is zero. In the non-phase-locked state, the sweep signal a is applied to the adder circuit 5 via the AND gate 10 and the capacitor 9. In the adder circuit 5, the sweep signal and the phase error signal are combined. This combined signal passes through the loop filter 6 and is applied to the voltage controlled oscillator 7 as a control signal. Therefore, the output frequency of the voltage controlled oscillator 7 is swept until it is locked into the carrier phase of the PSK signal.

Figure 2:
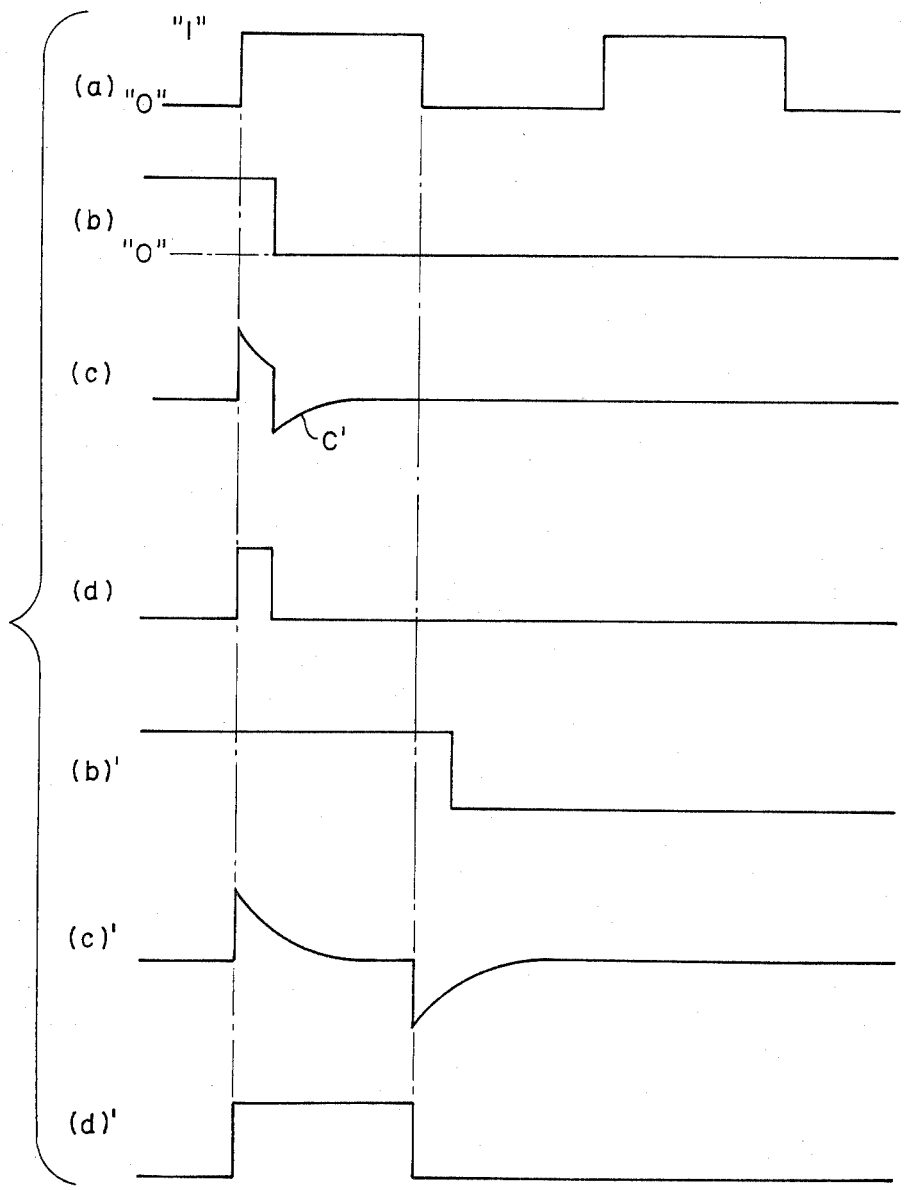
FIG. 2 is a graph of the output waveforms of the main circuits of the block diagram in FIG. 1.

FIG. 2 is a graph of the signal waveforms of FIG. 1. The sweep signal a is in FIG. 2 (a), the decision signal b in FIG. 2 (b), the signal c applied to the adder 5 via the capacitor 9 in FIG. 2 (c) and the output signal d of AND gate 10 in FIG. 2 (d), respectively. The sweep signal a repeats "1" and "0" in the constant period as shown in FIG. 2 (a) and is applied to the phase lock loop via the AND gate 10 when the decision signal b is "1" indicating the non-phase-locked state. The capacitor 9 is used in order to eliminate DC coupling between the output of the AND gate 10 and the phase lock loop, and to output the pseudo 3-level signal. A sweep in both positive and negative directions becomes possible by applying the sweep signal consisting of a rectangular wave through the capacitor 9.

When the decision signal b changes to "0", indicating the phase-locked state, from non-lock condition "1", indicating the non-phase locked state, the output of AND gate 10 becomes "0" without relation to the level of sweep signal a. Therefore, when the decision signal b changes to "0" while the sweep signal a is "1", an extra signal component C' is output as illustrated in FIG. 2 (c) through charging and discharging of the capacitor 9. Because of such extra signal component the phase-locked state is sometimes destroyed just as the phase-locked state is sometimes broken by disturbance.

FIG. 2 (b)', (c)' and (d)' are examples of the waveforms of decision signal b, output signal c of capacitor 9 and output signal d of AND gate 10 respectively. In this case since the decision signal b becomes "0" when the sweep signal a is "0", the signal applied to the phase lock loop is applied as the pseudo 3-level signal, resulting in no problem.

In summary, it has been observed that if the phase is locked and the sweep stops when the sweep signal a is "1", an extra sweep signal C' is generated, disturbing the phase lock loop.

Figure 3:
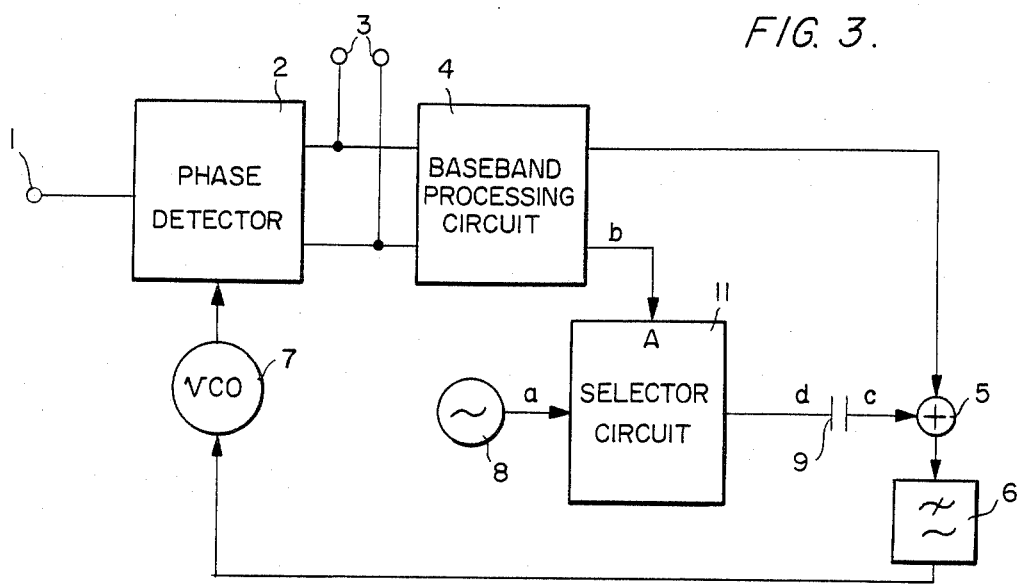
FIG. 3 is a block diagram of a phase lock loop where the supply of the sweep signal is controlled by a selector circuit.

FIG. 3 is the block diagram of an embodiment of the present invention. The same numerals and letters used in FIG. 1 indicate the same portions and 11 is the selector circuit. The selector circuit 11 receives, at the terminal A, the decision signal b sent from the baseband processing circuit 4, and outputs the signal d. When the decision signal b is "1", the sweep signal a which is the output of the sweep oscillator 8, is directly output. When the decision signal b is "0", the level of the output signal d is determined according to the level that the output signal d had when the decision signal b changed to "0" from "1". In other words, if the output signal d has the value of "0" when the decision signal b changes from "1" to "0", "0" continues to be the value of the output signal d and if "1" is the value of the output signal d, "1" continues to be the value of the output signal d. The general rule is that when the decision signal b is changed to "0", the preceding condition of the output signal d is maintained. The truth value table of the selector circuit 11 is given in Table 1 below.

TABLE 1

| b | a | $d^{-1}$ | d |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

In Table 1, b is the decision signal b, a is sweep signal a generated by the sweep generator 8; $d^{-1}$ is output signal d of the selector circuit 11 just before the decision signal b changes, and d is the output signal d from the selector circuit 11. If the initial value of decision signal b is "0", a value of $d^{-1}$ is uncertain and the output signal d of the selector circuit 11 is also uncertain.

Figure 4:
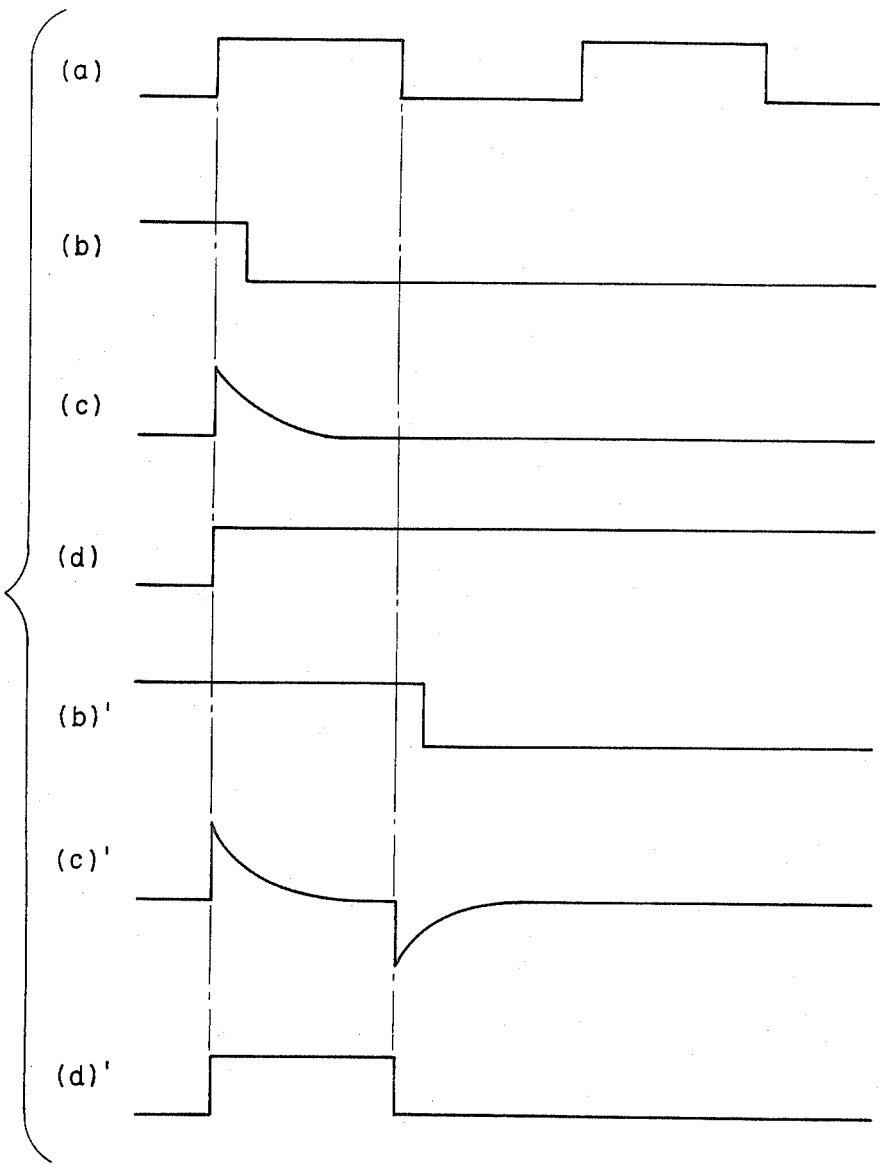
FIG. 4 is a graph of the output waveforms of the main circuits of the block diagram in FIG. 3.

FIG. 4 shows the signal waveforms for portions of FIG. 3. When the decision signal b becomes "0" while the sweep signal a is "1", the output signal d of the selector circuit 11 is held to "1" as can be seen in FIGS. 4 (a), 4 (b), and 4 (d). Thereby, the output signal c of the capacitor 9 in FIG. 4 (c) does not generate the extra sweep signal component C' in FIG. 2 (c).

When the decision signal b becomes "0" while the sweep signal a is "0", the output signal d of the selector circuit 11 remains "0" as can be seen in FIGS. 4 (a), 4 (b)' and 4 (d)' and the output signal c of capacitor 9 changes to the signal indicated in FIG. 4 (c)'. In this case, the signal waveforms obtained are the same as these in FIG. 2 (b)', 2 (c)', and 2 (d)'.

As explained above, the output signal d of the selector circuit 11 holds the state "1" if the sweep signal a is "1", when the non-phase-locked state changes to the phase-locked state and the sweep is no longer passed to the voltage controlled oscillator 7. Therefore, unwanted sweep signal C' of FIG. 2 (c) which has been observed in the prior art is not generated and thereby the phase-locked state can be maintained.

Figure 5:
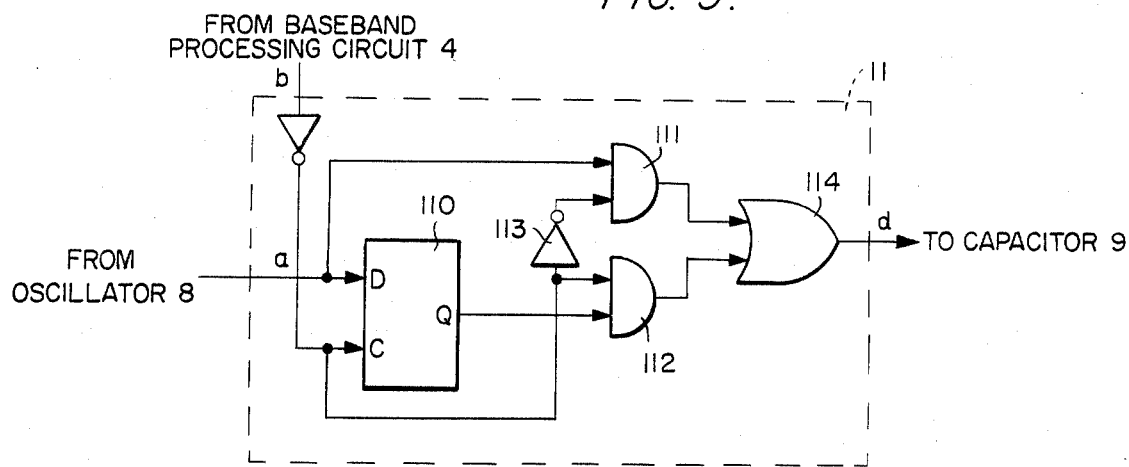
FIG. 5 is a logic circuit diagram of an embodiment of the selector circuit.

The selector circuit 11 in FIG. 3 can be easily formed by a logic circuit based on the truth value table in Table 1. FIG. 5 is a logic diagram of an embodiment of the selector circuit 11.

In FIG. 5, 110 is a flip-flop; 111 and 112 are AND gates; 113 is an inverter; 114 is an OR gate. The decision signal b generated by the baseband processing circuit 4 is input to the terminal C of the flip-flop 110, inverter 113 and AND gate 112, while the sweep signal a generated by the sweep oscillator 8 is input to the terminal D of flip-flop 110 and AND gate 111. Thereby, the output of the OR gate 114 is the output signal d of the selector circuit 11.

Figure 6:
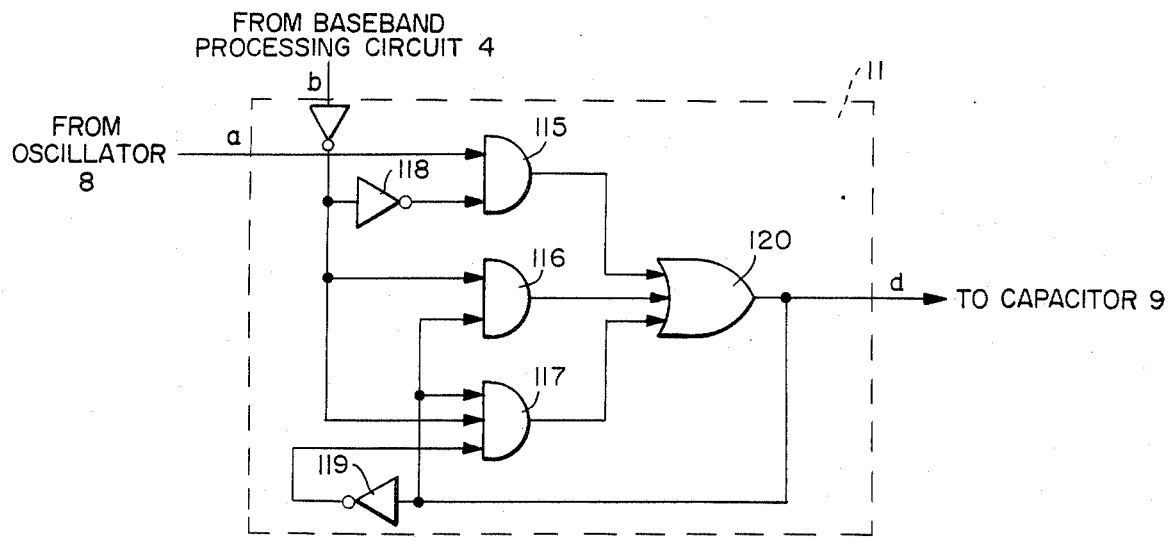
FIG. 6 is a logical circuit indicating another embodiment of the selector circuit.

FIG. 6 is another structure of the selector circuit 11. In this figure, 115, 116 and 117 are AND gates; 118 and 119 are inverters; and 120 is an OR gate. The decision signal b generated from the baseband processing circuit 4 is input to the inverter 118 and AND gates 116 and 117, while the sweep signal a generated from the sweep oscillator 8 is input to the AND gate 115. The output of the OR gate 120 is the output d of the selector circuit 11.

In more practical terms, Motorola's CMOS-IC MC14052B can be used as the selector circuit 11.

As explained above, the present invention results in an advantage in that the sweep signal a is suspended and held at its existing level when the decision signal b indicates the phase-locked state, and thereby an unwanted signal is not generated when the sweep stops. Moreover, stable phase-locked operation can be realized. It is, of course, possible for the decision signal b to have values opposite to those used in this embodiment, namely "0" in the non-phase-locked state and "1" in the phase-locked state. In that case, it would be necessary to change the logic structure of the selector circuit to correspond to the logic of the decision signal b.

I claim:

1. A phase-locked loop circuit receiving a phase shift keying signal, comprising:
   an input terminal for receiving the phase shift keying signal;
   a phase detector, operatively connected to said input terminal, for synchronously detecting the phase shift keying signal and generating demodulated data;
   a baseband processing circuit, operatively connected to said phase detector, for processing the demodulated data from said phase detector, and outputting a phase error signal and a decision signal indicating whether the loop is in a phase-locked state;
   a sweep oscillator for generating a sweep signal;
   a selector circuit, operatively connected to said sweep oscillator and said baseband processing circuit and having input terminals for receiving the decision signal and the sweep signal, and having an output terminal for outputting the sweep signal when the decision signal does not indicate the phase-locked state and, when the decision signal indicates the phase-locked state, for outputting the level which the sweep signal supplied just before the decision signal changed to indicate the phase-locked state;
   a coupling capacitor operatively connected to the output terminal of said selector circuit;
   an adder circuit, operatively connected to said coupling capacitor and said baseband processing circuit, for adding the output of said selector circuit to the phase error signal;
   a low-pass filter, operatively connected to said adder circuit, for filtering the output of said adder circuit; and
   a voltage controlled oscillator, operatively connected to said low-pass filter and said phase detector, for receiving the output of said low-pass filter as a control signal, and for generating a recovered carrier signal, said phase detector circuit using the recovered carrier signal to detect the phase shift keying signal.

2. A phase-locked loop circuit according to claim 1, wherein said phase shift keying signal received by said input terminal has four levels.

3. A phase-locked loop circuit according to claim 1 or 2, wherein the sweep signal from said sweep oscillator is a square wave.

4. A phase-locked loop circuit receiving an input signal, comprising:
   sweep signal means for generating a sweep signal having a level;
   phase-locked loop means, operatively connected to receive the input signal, for demodulating the input signal using a phase-locked loop by adding the sweep signal to a phase signal and for outputting a decision signal indicating one of a phase-locked state and a phase-unlocked state; and
   sweep signal freeze means, operatively connected to said sweep signal means and said phase-locked loop means, for maintaining the sweep signal at the level being output when the decision signal indicates the phase-locked state, until the decision signal indicates the phase-unlocked state.

5. A phase-locked loop circuit according to claim 4, wherein said sweep signal freeze means comprises:
   a first inverter operatively connected to said phase-locked loop means;
   a flip-flop operatively connected to said sweep signal means and said first inverter;
   a first AND gate operatively connected to said first inverter and said flip-flop;
   a second inverter operatively connected to said first inverter;
   a second AND gate operatively connected to said sweep signal means and said second inverter; and
   an OR gate operatively connected to said first and second AND gate and said phase-locked loop means.

6. A phase-locked loop circuit according to claim 4, wherein said sweep signal freeze means comprises:
   a first inverter operatively connected to said phase-locked loop means;
   a second inverter operatively connected to said first inverter;
   a first AND gate operatively connected to said sweep signal means and said second inverter;
   a second AND gate operatively connected to said first inverter;
   a third AND gate operatively connected to said first inverter;
   an OR gate operatively connected to said first, second and third AND gates and said phase-locked loop means; and
   a third inverter operatively connected to said OR gate and said third AND gate.

* * * * *